(12) United States Patent
Kim

(10) Patent No.: US 7,274,228 B2
(45) Date of Patent: *Sep. 25, 2007

(54) METHOD AND APPARATUS FOR DIGITAL PHASE GENERATION AT HIGH FREQUENCIES

(75) Inventor: Kang Yong Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/413,790

(22) Filed: Apr. 28, 2006

(65) Prior Publication Data

US 2006/0192601 A1 Aug. 31, 2006

Related U.S. Application Data

(63) Continuation of application No. 10/896,159, filed on Jul. 20, 2004, now Pat. No. 7,057,429.

(51) Int. Cl.
*H03L 7/06* (2006.01)

(52) U.S. Cl. .................................. 327/149; 327/158

(58) Field of Classification Search ............... 327/149, 327/153, 158, 161, 162, 163; 331/17, 25, 331/375, 376; 375/373–376
See application file for complete search history.

(56) References Cited

U.S. PATENT DOCUMENTS

| | | | |
|---|---|---|---|
| 5,537,068 A | 7/1996 | Konno | 327/115 |
| 5,828,250 A | 10/1998 | Konno | 327/116 |
| 6,069,507 A | 5/2000 | Shen et al. | 327/156 |
| 6,100,735 A | 8/2000 | Lu | 327/158 |
| 6,259,295 B1 | 7/2001 | Kriz et al. | 327/296 |
| 6,275,084 B1 * | 8/2001 | McAdams | 327/239 |
| 6,323,705 B1 | 11/2001 | Shieh et al. | 327/158 |
| 6,445,231 B1 | 9/2002 | Baker et al. | 327/158 |
| 6,535,043 B2 | 3/2003 | Chen | 327/291 |
| 6,636,093 B1 | 10/2003 | Stubbs et al. | 327/161 |
| 6,650,160 B2 | 11/2003 | Tanahashi | 327/277 |
| 6,727,739 B2 | 4/2004 | Stubbs et al. | 327/161 |
| 6,794,912 B2 | 9/2004 | Hirata et al. | 327/158 |
| 6,812,760 B1 | 11/2004 | Kim et al. | 327/158 |
| 2002/0172314 A1 | 11/2002 | Lin et al. | 327/376 |
| 2002/0180501 A1 | 12/2002 | Baker et al. | 327/158 |
| 2003/0117194 A1 | 6/2003 | Lee | 327/158 |
| 2005/0030075 A1 | 2/2005 | Kim et al. | 327/158 |
| 2006/0044931 A1 | 3/2006 | Kim | 365/233 |

* cited by examiner

*Primary Examiner*—Linh My Nguyen
(74) *Attorney, Agent, or Firm*—TraskBritt, PC

(57) ABSTRACT

An apparatus and method for generating phase related clocks, includes delaying a clock input by a cycle delay magnitude to generate a cycle delay signal and N delay taps is disclosed. Each delay tap has a delay equal to a fractional amount of the cycle delay magnitude. The method further includes delaying the clock input by an alignment magnitude to generate a first aligned phase signal and delaying each of the N delay taps by fractional amounts of the alignment magnitude to generate N phase aligned signals. A feedback loop is closed by a phase comparison between the first aligned phase signal and the cycle delay signal. The phase comparison result is used to adjust the cycle delay magnitude, which adjusts delays of the cycle delay signal and the N delay taps, and adjust the alignment magnitude, which adjusts delays of the first aligned phase signal and the N phase aligned signals.

30 Claims, 7 Drawing Sheets

ID
METHOD AND APPARATUS FOR DIGITAL PHASE GENERATION AT HIGH FREQUENCIES

CROSS-REFERENCE TO RELATED APPLICATION

This application is a continuation of U.S. patent application Ser. No. 10/896,159, filed Jul. 20, 2004, now U.S. Pat. No. 7,057,429, issued Jun. 6, 2006.

BACKGROUND OF THE INVENTION

1. Field of the Invention

This invention relates generally to delay locked loops, and particularly to multiple phase generation using delay locked loops.

2. Description of Related Art

In modern high frequency integrated circuits, it is often necessary to generate internal clocks with predetermined phase relationships to a reference clock. Conventionally, a Phase Locked Loop (PLL) or Delay Locked Loop (DLL) has been used to generate these predetermined phase relationships. For example, many reference input clocks may not have a 50% duty cycle. However, with modern semiconductor devices, such as Double Data Rate (DDR) Dynamic Random Access Memory (DRAM) devices, two data cycles may occur within one clock cycle. An internal clock with a 50% duty cycle may be needed so the two data cycles may be accurately sampled at the rising edge and the falling edge of the clock. Alternatively, an additional clock with a phase delay of 180 degrees relative to the reference clock may be used to sample one data slice and the reference clock may be used to sample the other data slice. Furthermore, modern semiconductor devices, such as DRAMS and processors, may require multiple clocks with defined phase relationships to trigger events at various times during a clock cycle. For example, it may be desirable to have clocks with phase relationships of 90°, 180°, 270°, and 360° relative to a reference clock.

Various solutions exist for generating these desired duty cycles and clocks with defined phase relationships; these solutions are conventionally referred to as Duty Cycle Correctors (DCC) and phase generators. Conventionally, phase generators may be constructed as a DLL using either analog or digital delay lines. Analog delay lines may allow more precise control but may consume more silicon real estate, consume more power, and take longer to achieve lock. Digital delay lines, on the other hand, are easier to design, smaller, and may consume less power. Digital delay lines may achieve lock faster than analog delay lines; however, digital delay lines may not be able to achieve the continuous fine-tuning available in an analog delay line.

A conventional phase generator constructed as a DLL is shown in FIG. 1. A clock input 5 (also referred to as a ph0 signal) connects to a first delay line 10. A ph180 signal 15, generated by the first delay line 10, connects to a second delay line 20. A ph360 signal 25, from the output of the second delay line 20, feeds back to a phase detector 50. The phase generator compares the phase of the clock input 5 to the second delay line output of ph360 signal 25. Because of the comparison, the phase detector generates the delay control signal 55 controlling the delay lines (10 and 20) to either increase or decrease the delay. The first delay line 10 and second delay line 20 are of similar construction such that the delay control signal 55, connected to both delay lines (10 and 20), causes both delay lines to generate the same amount of delay. With this closed loop, the DLL "locks" on to the clock input 5 so that the ph360 signal 25 is at substantially the same phase and frequency as the clock input 5.

Because the two delay lines generate equivalent delays, the ph180 signal 15 is at the same frequency as, and 180 degrees out of phase with, the clock input 5. The phase detector 50 only compares rising edge to rising edge or falling edge to falling edge. As a result, the phase generator will lock and generate the ph180 signal 15 at 180 degrees out of phase regardless of the duty cycle of the clock input 5.

However, conventional digital DLL phase generators have their limits. Due to the structure of the delay lines, there is a minimum delay and a maximum delay possible through each delay line. The lowest frequency input clock that the DLL is able to lock to is defined by the maximum delay. For example, if the maximum delay through each delay line is 50 nSec, the total maximum delay is 100 nSec, and the DLL can lock to clock frequencies of 10 Mhz or higher. On the other hand, if the minimum delay through each delay line is 2.5 nSec, the total minimum delay is 5 nSec. Consequently, if the input clock is faster than 200 Mhz (i.e., a clock period of less than 5 nSec), the DLL can not lock to the clock input because the ph360 signal 25 cannot be brought any closer to the ph0 signal 5 than the minimum delay. Conventionally, DLL design is a trade-off between locking range (i.e., maximum delay) and maximum speed (i.e., minimum delay).

There is a need for a digital phase generator that can lock and operate at higher frequencies without affecting the overall locking range of the DLL within the digital phase generator.

BRIEF SUMMARY OF THE INVENTION

The present invention enables digital phase generators and methods of generating multi-phase signals at higher clock speeds. An embodiment of the present invention comprises a method of generating three phase related clocks. The method includes delaying a clock input by a phase delay magnitude to generate a first phase signal and delaying the first phase signal by the same phase delay magnitude to generate a last phase signal. The phase signals may be further aligned to generate the proper phase relationships by delaying the clock input by an alignment magnitude to generate a first aligned phase signal and delaying the first phase signal by about one-half of the alignment magnitude to generate a second aligned phase signal. The DLL loop may be closed by detecting a phase difference between the first aligned phase signal and the last phase signal. As a result of the phase comparison, the method may comprise adjusting the phase delay magnitude to adjust delays of the first phase signal and the last phase signal. Also as a result of the phase comparison, the method may comprise adjusting the alignment magnitude to adjust delays of the first aligned phase signal and the second aligned phase signal.

Another embodiment of the present invention comprises a method of generating five phase related clocks. The method includes delaying a clock input by a phase delay magnitude to generate a first phase signal, delaying the first phase signal by the same phase delay magnitude to generate a second phase signal, delaying the second phase signal by the same phase delay magnitude to generate a third phase signal, and delaying the third phase signal by the same phase delay magnitude to generate a last phase signal. The phase signals may be further aligned to generate the proper phase relationships by delaying the clock input by an alignment magnitude to generate a first aligned phase signal, delaying the first phase signal by about ¾ of the alignment magnitude to generate a second aligned phase signal, delaying the second phase signal by about ½ of the alignment magnitude to generate a third aligned phase signal, and delaying the third phase signal by about ¼ of the alignment magnitude to generate a fourth aligned phase signal. The DLL loop may be closed by detecting a phase difference between the first aligned phase signal and the last phase signal. As a result of the phase comparison, the method may comprise adjusting the phase delay magnitude to adjust delays of the first phase signal, the second phase signal, the third phase signal, and the last phase signal. Also as a result of the phase comparison, the method may comprise adjusting the alignment magnitude to adjust delays of the first aligned phase signal, the second aligned phase signal, the third aligned phase signal and the fourth aligned phase signal.

Another embodiment of the present invention comprises a method of generating a variety of phase related clocks. The method includes delaying a clock input by a cycle delay magnitude to generate a full cycle delay signal and generating N delay taps from the clock input, each delay tap including a tap delay magnitude equal to a fractional amount of the cycle delay magnitude. The method further includes delaying the clock input by an alignment magnitude to generate a first aligned phase signal and delaying each of the N delay taps by a tap alignment delay to generate N phase aligned signals. The DLL loop may be closed by detecting a phase difference between the first aligned phase signal and the full cycle delay signal. As a result of the phase comparison, the method may comprise adjusting the cycle delay magnitude to adjust delays of the full cycle delay signal and the N delay taps. Also as a result of the phase comparison, the method may comprise adjusting the alignment magnitude to adjust delays of the first aligned phase signal and the N phase aligned signals.

Another embodiment of the present invention comprises a phase generator for generating three phase related clocks, including a first delay line configured to generate a first phase signal with a phase delay magnitude relative to a clock input and a second delay line configured to generate a last phase signal with the same phase delay magnitude relative to the first phase signal. The phase generator further includes a first phase aligner configured to generate a first aligned phase signal with an alignment magnitude relative to the clock input and a second phase aligner configured to generate a second aligned phase signal with substantially ½ the alignment magnitude relative to the first phase signal. A phase detector is included, which may close the DLL loop by detecting a phase difference between the first aligned phase signal and the last phase signal. As a result of the phase comparison, the method may comprise adjusting the phase delay magnitude to adjust delays of the first phase signal and last phase signal. Also as a result of the phase comparison, the method may comprise adjusting the alignment magnitude to adjust delays of the first aligned phase signal and the second aligned phase signal.

Another embodiment of the present invention comprises a phase generator for generating five phase related clocks, including a first delay line configured to generate a first phase signal with a phase delay magnitude relative to a clock input, a second delay line configured to generate a second phase signal with the same phase delay magnitude relative to the first phase signal, a third delay line configured to generate a third phase signal with the same phase delay magnitude relative to the second phase signal, and a fourth delay line configured to generate a last phase signal with the same phase delay magnitude relative to the third phase signal. The phase generator further includes a first phase aligner configured to generate a first aligned phase signal with an alignment magnitude relative to the clock input, a second phase aligner configured to generate a second aligned phase signal with substantially ¾ the alignment magnitude relative to the first phase signal, a third phase aligner configured to generate a third aligned phase signal with substantially ½ the alignment magnitude relative to the second phase signal, a fourth phase aligner configured to generate a fourth aligned phase signal with substantially ¼ the alignment magnitude relative to the third phase signal. A phase detector is included, which may close the DLL loop by detecting a phase difference between the first aligned phase signal and the last phase signal. As a result of the phase comparison, the method may comprise adjusting the phase delay magnitude to adjust delays of the first phase signal, the second phase signal, the third phase signal, and the last phase signal. Also as a result of the phase comparison, the method may comprise adjusting the alignment magnitude to adjust delays of the first aligned phase signal, the second aligned phase signal, the third aligned phase signal and the fourth aligned phase signal.

Another embodiment of the present invention comprises a phase generator for generating a variety of phase related clocks including an adjustable delay line configured for generating a full cycle delay signal by delaying a clock input by a cycle delay magnitude. The delay line includes N delay taps with each of the N delay taps having a tap delay magnitude equal to a fractional amount of the cycle delay magnitude. The phase generator further includes a first phase aligner configured for generating a first aligned phase signal by delaying the clock input by an alignment magnitude. N phase aligned signals are generated by each of N phase aligners, which are connected to a corresponding delay tap of the N delay taps and are configured to generate a phase aligned signal with a tap alignment delay relative to its delay tap. A phase detector is included, which may close the DLL loop by detecting a phase difference between the first aligned phase signal and the full cycle delay signal. As a result of the phase comparison, the method may comprise adjusting the cycle delay magnitude to adjust delays of the full cycle delay signal and the N delay taps. Also as a result of the phase comparison, the method may comprise adjusting the alignment magnitude to adjust delays of the first aligned phase signal and the N phase aligned signals.

Another embodiment of the present invention comprises a semiconductor device including at least one phase generator according to the invention described herein.

Another embodiment of the present invention includes at least one semiconductor device including at least one phase generator according to the present invention fabricated on a semiconductor wafer.

Yet another embodiment, in accordance with the present invention comprises an electronic system including at least one input device, at least one output device, at least one processor, and at least one memory device. The at least one memory device comprises at least one semiconductor memory incorporating at least one phase generator according to the present invention.

BRIEF DESCRIPTION OF THE DRAWINGS

In the drawings, which illustrate what is currently considered to be the best mode for carrying out the invention.

DETAILED DESCRIPTION OF THE INVENTION

In the following description, circuits and functions may be shown in block diagram form in order not to obscure the present invention in unnecessary detail. Conversely, specific circuit implementations shown and described are exemplary only, and should not be construed as the only way to implement the present invention unless specified otherwise herein. Additionally, block definitions and partitioning of logic between various blocks is exemplary of a specific implementation. It will be readily apparent to one of ordinary skill in the art that the present invention may be practiced by numerous other partitioning solutions. For the most part, details concerning timing considerations and the like have been omitted inasmuch as such details are not necessary to obtain a complete understanding of the present invention and are within the abilities of persons of ordinary skill in the relevant art.

The term "bus" is used to refer to a plurality of signals or conductors, which may be used to transfer one or more various types of information, such as data, addresses, control, or status. Additionally, a bus or collection of signals may be referred to in the singular as a signal.

Figure 1:
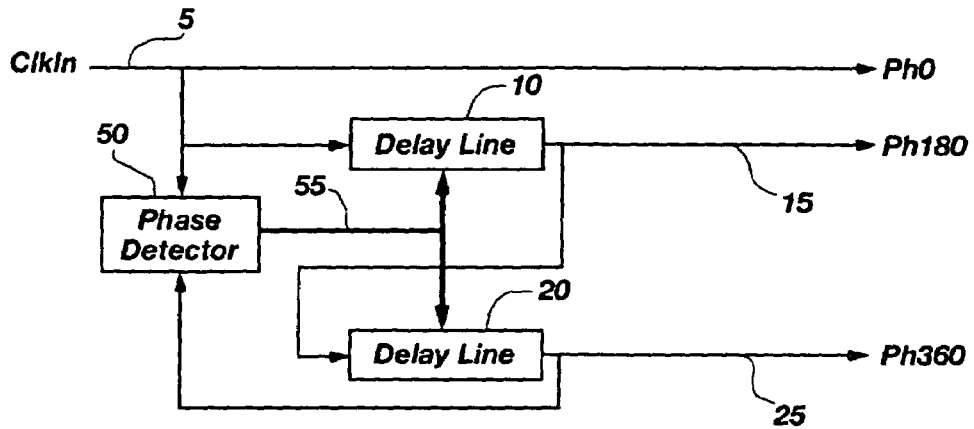
FIG. 1 is a block diagram of a conventional digital phase generator.
Figure 2:
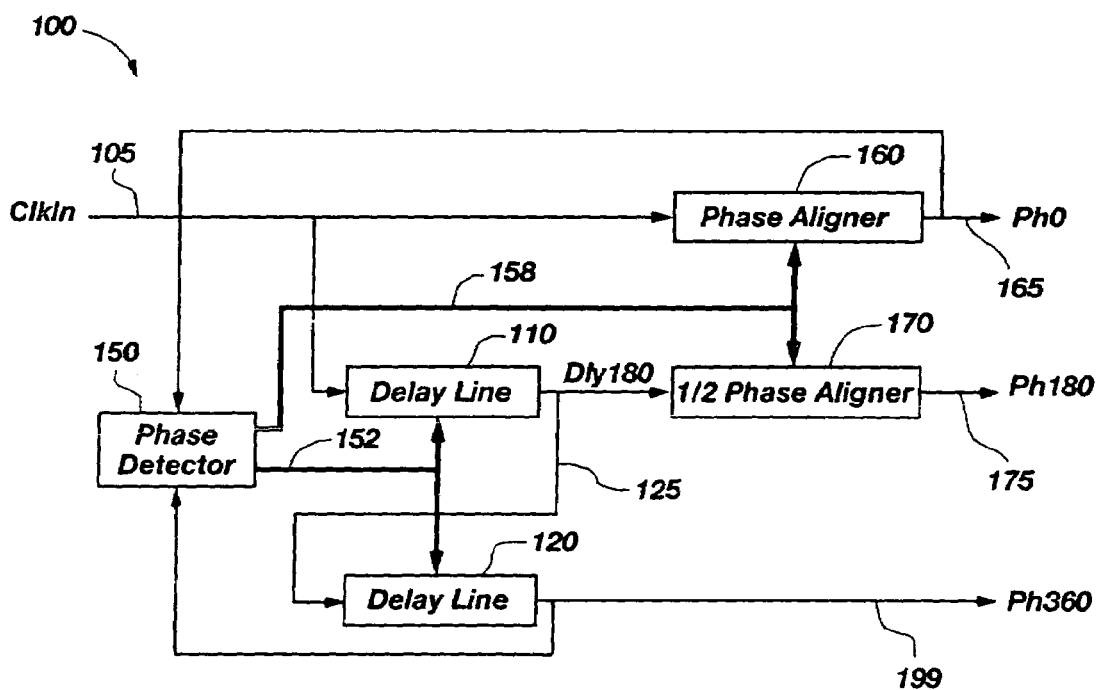
FIG. 2 is a block diagram of an exemplary digital phase generator according to the present invention including two delay lines to generate a 180 degree phase signal.

As shown in FIG. 2, a phase generator 100 according to the present invention includes a phase detector 150, a first delay line 110, a second delay line 120, a first phase aligner 160, and a second phase aligner 170. A clock input 105 connects to the first delay line 110. A dly180 signal 125 (also referred to as a first phase signal) is generated by the first delay line 110 and connects to the second delay line 120. A ph360 signal 199 (also referred to as a last phase signal) is generated by the second delay line 120 and feeds back to the phase detector 150.

The clock input 105 also connects to the first phase aligner 160. A ph0 signal 165 (also referred to as a first aligned phase signal) is generated by the first phase aligner 160 and feeds back to the phase detector 150. A second phase aligner 170 connects to the dly180 signal 125 and generates a ph180 signal 175 (also referred to as a second aligned phase signal).

The first and second delay lines (110 and 120) may be configured similarly with the same selectable delay increments. Consequently, both delay lines (110 and 120) will have substantially the same delay magnitude based on a phase adjustment signal 152, which is generated by the phase detector 150 and selects the delay increments, and as a result, the delay magnitude for both delay lines.

An alignment adjustment signal 158, generated by the phase detector 150, controls the alignment magnitudes (i.e., delay) of the first and second phase aligners (160 and 170). The second phase aligner 170 may be configured with delay increments that are ½ the size of the delay increments for the first phase aligner 160. Consequently, for any given value on the alignment adjustment signal 158, the second phase aligner 170 generates a delay magnitude that is substantially ½ the delay magnitude generated by the first phase aligner 160.

A set of equations may be defined to show the delay relationships from the clock input 105 to the ph0 signal 165, the ph180 signal 175 and the ph360 signal 199. In the equations, tA indicates the alignment magnitude for the first phase aligner 160 and tD indicates a phase delay magnitude in the delay lines (110 and 120).

$$td1(Clkin\ to\ ph0)=ph0-Clkin=tA$$

$$td2(Clkin\ to\ ph180)=ph180-Clkin=tD+\tfrac{1}{2}tA$$

$$td3(Clkin\ to\ ph360)=ph360-Clkin=2*tD$$

When the phase generator 100 is locked, the ph360 signal 199 should be about one clock cycle, or other integer multiple of the clock cycle, behind the ph0 signal 165. In addition, the ph180 signal 175 should be substantially near the midpoint between the ph0 signal 165 and the ph360 signal 199. The following equations, derived from combinations of the above equations illustrate the timing relationships between the various outputs when the phase generator 100 is locked.

$$tclk=td4(ph0\ to\ ph360)=td3-td1=(2*tD)-tA$$

$$\tfrac{1}{2}tclk=td5(ph0\ to\ ph180)=td2-td1=tD-\tfrac{1}{2}tA$$

$$\tfrac{1}{2}tclk=td6(ph180\ to\ ph360)=td3-td2=tD-\tfrac{1}{2}tA$$

The phase generator 100 may be contemplated as having two operation modes. In a first operation mode, the phase aligners (160 and 170) may be set to a predetermined value and the pair of delay lines (110 and 120) may be adjusted to effectively lock to the phase and frequency of the clock input 105. In other words, using the delay equations, hold tA constant and vary tD to achieve lock.

In a second operation mode, the pair of delay lines (110 and 120) may be set to a predetermined value and the alignment magnitude may be adjusted until the phase generator 100 locks the ph0 signal 165 to the ph360 signal 199. In other words, using the delay equations, hold tD constant and vary tA to achieve lock.

A group of timing diagrams illustrates the locking process, adjustment of the phase delay magnitude, and adjustment of the alignment magnitude. In the timing diagrams, arbitrary units are used to illustrate the various timing edge movements. These arbitrary units are not intended to illustrate actual delay numbers. For example, the clock cycles in the timing diagrams vary between 14 units and 6 units, and illustrate a minimum delay for the delay lines of 6 units. As an example of current process parameters for a design that may implement the present invention, the minimum delay through the delay lines may be about one to two nanoseconds. In addition, the timing diagrams all show references to rising edges of the various signals. It will be readily apparent to a person of ordinary skill in the art that the phase detector 150 may, alternatively, operate with respect to falling edges and the timing diagrams would be referenced to falling edges.

Figure 6A:
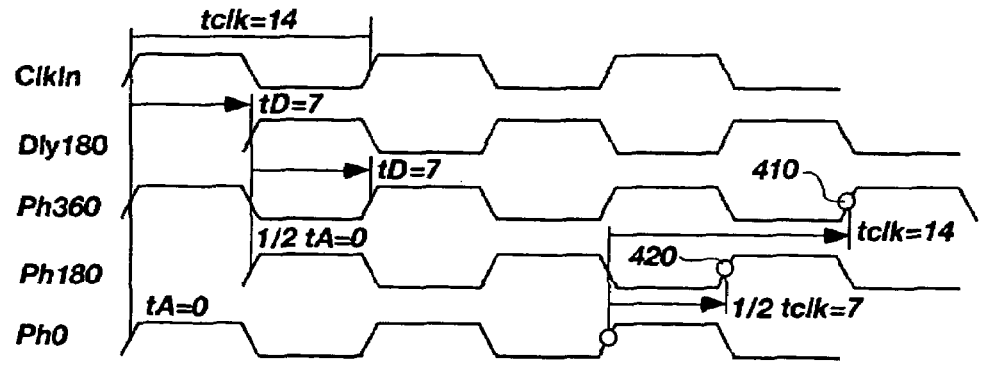
FIG. 6A is a timing waveform showing operation of various phases for the FIG. 2 embodiment at a clock cycle of 14 units and substantially zero alignment delay.
Figure 6B:
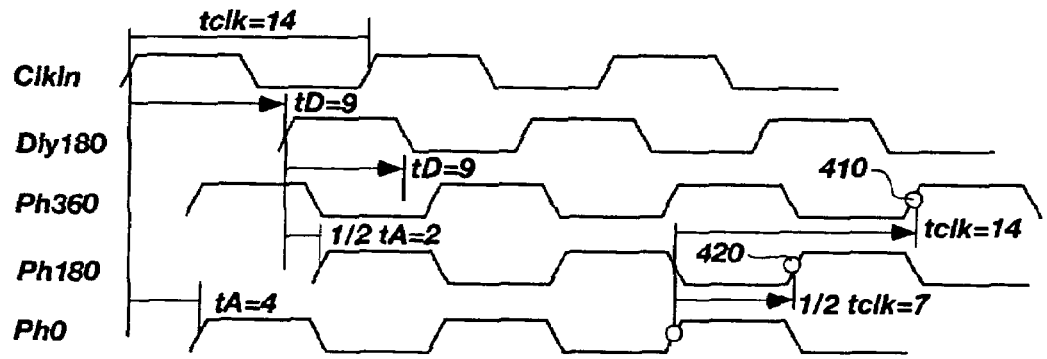
FIG. 6B is a timing waveform showing operation of various phases for the FIG. 2 embodiment at a clock cycle of 14 units and a predetermined alignment delay.
Figure 6C:
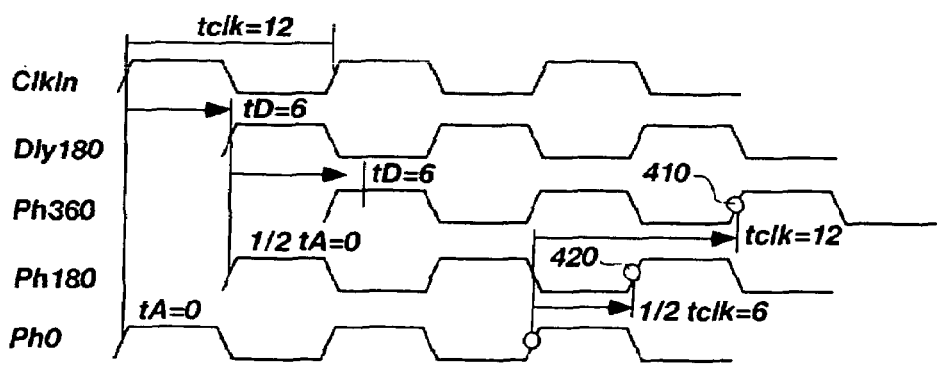
FIG. 6C is a timing waveform showing operation of various phases for the FIG. 2 embodiment at a clock cycle of 12 units.

The first operation mode is illustrated by FIGS. 6A, 6B, and 6C. The first operation mode may typically be used when the clock cycle is larger than the minimum delay of the first delay line 110 and the second delay line 120 combined. In the first operation mode, with the phase aligners set to a predetermined amount, the phase delay magnitude is adjusted in each of the delay lines to achieve lock.

For example, with reference to FIGS. 2 and 6A, the alignment magnitude (noted in the timing diagrams as tA) is set to substantially near zero. This may be implemented as a bypass function within the first phase aligner 160 and second phase aligner 170. With the alignment magnitude at substantially zero the second phase aligner 170 has a delay of about ½ the alignment magnitude, which will also be substantially near zero (noted in the timing diagrams as ½ tA). With these settings for the alignment magnitudes, the ph0 signal 165 follows the clock input 105 and the ph180 signal 175 follows the dly180 signal 125. When the alignment magnitude is substantially near zero, the phase generator 100 is similar to a conventional phase generator. The phase detector 150 compares the ph0 signal 165 to the ph360 signal 199 to determine a phase error. As a result of the phase error, the phase detector 150 controls the phase adjustment signal 152 to either increase or decrease the phase delay magnitude (noted in the timing diagrams as tD).

If the delay lines are implemented as a conventional set of delays controlled by a shift register, the phase adjustment signal 152 may be implemented as shift left/shift right set of signals. Shift left may indicate a smaller phase delay magnitude while shift right may indicate a larger phase delay magnitude. Because the first delay line 110 and second delay line 120 are in series, an indication to change the phase delay magnitude by one increment will actually increase the total delay between the clock input 105 and the ph360 signal 199 by two increments.

The feedback loop, including phase comparison combined with increasing or decreasing adjustments of the phase delay magnitude, continues until the phase comparison shows the phase of the clock input 105 and the ph360 signal 199 are substantially in phase. In FIG. 6A, with a clock cycle of 14 units, when phase lock is achieved, the phase delay magnitude is about 7 units. As shown by the first alignment indicator 410, the rising edges of the ph360 signal 199 is substantially one clock cycle after the ph0 signal 165. Also, the second alignment indicator 420 shows the rising edge of the ph180 signal 175 is substantially ½ the clock cycle after the ph0 signal 165.

In another example of the first operation mode, with reference to FIGS. 2 and 6B, the alignment magnitude is set to an initial value of four units. With the alignment magnitude at four units, the second phase aligner 170 has a delay of two units, which is ½ the alignment magnitude. In this example, the ph0 signal 165 starts out at a delay of four units relative to the clock input 105. Similarly, the ph180 signal 175 starts out at a delay of two units relative to the dly180 signal 125.

The feedback loop, including the phase comparison combined with increasing or decreasing adjustments of the phase delay magnitude, continues until the phase comparison shows the phase of the clock input 105 and the ph360 signal 199 are substantially in phase. In FIG. 6B, with a clock cycle of 14 units, when phase lock is achieved, the phase delay magnitude is about 9 units. As shown by the first alignment indicator 410, the rising edges of the ph360 signal 199 is substantially one clock cycle after the ph0 signal 165. Also, the second alignment indicator 420 shows the rising edge of the ph180 signal 175 is substantially ½ the clock cycle after the ph0 signal 165. This phase delay magnitude is consistent with the equations noted above. Namely, td4 (ph0 to ph360)=(2*tD)-tA=(2*9)-4=14, and td5 (ph0 to ph180)=tD-½ tA=9-½(4)=7.

In a final example of the first operation mode, with reference to FIGS. 2 and 6C, the clock period of 12 is substantially near the minimum delay through the first delay line 110 and the second delay line 120. In this example, the alignment magnitude is set to an initial value substantially near zero giving the first phase aligner 160 and the second phase aligner 170 delays substantially near zero.

The feedback loop, including the phase comparison combined with increasing or decreasing adjustments of the phase delay magnitude, continues until the phase comparison shows the phase of the clock input 105 and the ph360 signal 199 are substantially in phase. In FIG. 6C, with a clock cycle of 12 units, when phase lock is achieved, the phase delay magnitude is about 6 units. As shown by the first alignment indicator 410, the rising edges of the ph360 signal 199 is substantially one clock cycle after the ph0 signal 165. Also, the second alignment indicator 420 shows the rising edge of the ph180 signal 175 is substantially ½ the clock cycle after the ph0 signal 165. With the clock cycle at or near the minimum delay of the delay lines, the phase delay magnitude cannot be decreased any further and phase lock will not be possible at smaller clock periods unless the alignment magnitude is increased.

Figure 7A:
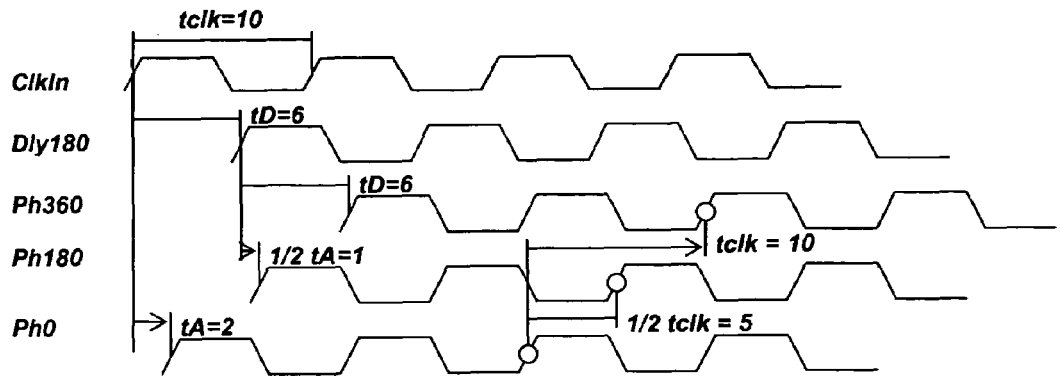
FIG. 7A is a timing waveform showing operation of various phases for the FIG. 2 embodiment at a clock cycle of 10 units.
Figure 7B:
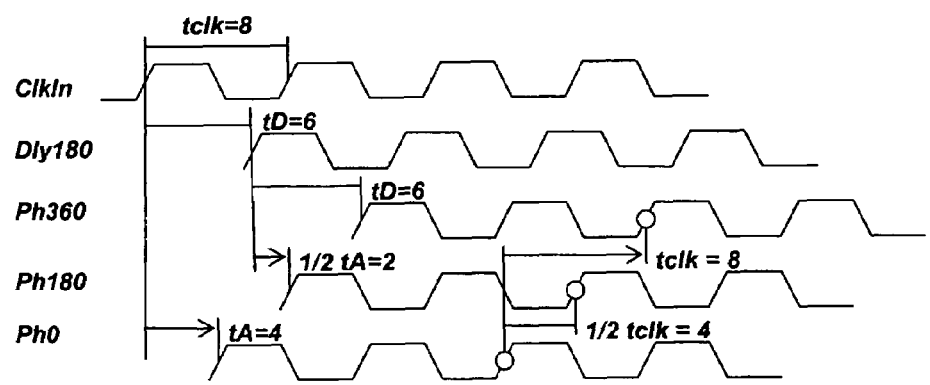
FIG. 7B is a timing waveform showing operation of various phases for the FIG. 2 embodiment at a clock cycle of 8 units.
Figure 7C:
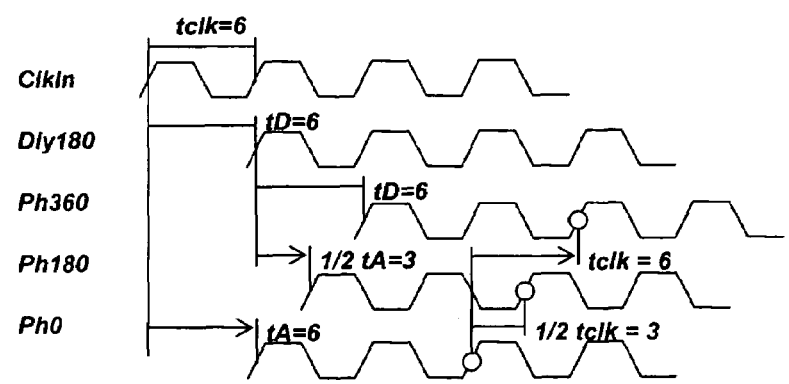
FIG. 7C is a timing waveform showing operation of various phases for the FIG. 2 embodiment at a clock cycle of 6 units.

This situation is when the second operation mode becomes advantageous. In the second operation mode, the phase delay magnitude is held constant, perhaps at the minimum delay, while the alignment magnitude is adjusted. The second operation mode is illustrated in FIGS. 7A, 7B, and 7C. In the second mode of operation, the first phase aligner 160 may be contemplated as an element that effectively compresses the clock cycle (i.e., the delay between the ph0 signal 165 and the ph360 signal 199), which could not be completely compressed to match the clock input 205 by the phase delay lines because the phase delay magnitude is held constant.

For example, with reference to FIGS. 2 and 7A, the phase delay magnitude is set to the minimum delay of 6 units and the clock cycle is 10 units. With the phase delay magnitude at 6, the rising edge of the ph360 signal 199 is greater than a clock cycle delay from the rising edge of the clock input 105. However, the first phase aligner 160 may be used to delay the ph0 signal 165 so that the delay from the ph0 signal 165 to the ph360 signal 199 is substantially near a clock cycle, or integer multiple of a clock cycle. In the second operational mode, the phase detector 150 may detect a phase difference between the ph0 signal 165 and the ph360 signal 199. However, rather than changing the phase adjustment signal 152 to modify the phase delay magnitude, the phase detector 150 changes the alignment adjustment signal 158 to increasing or decreasing the alignment magnitude to achieve phase lock. If the alignment magnitude starts near zero, the phase detector 150 will increase the alignment magnitude until the ph0 signal 165 and the ph360 signal 199 are substantially in phase. In FIG. 7A, the alignment magnitude is adjusted to 2 units. Since the ph360 signal 199 is essentially held at fixed point and the ph0 signal 165 is moved closer to the ph360 signal 199, the ph180 signal 175 must also be moved closer to the ph360 signal 199. However, the ph180 signal 175 should only be moved by ½ as much as the ph0 signal 165 to maintain the phase relationship at 180 degrees. Adjusting the alignment magnitude is consistent with the equations noted above. Namely, td4 (ph0 to ph360)=(2*tD)−tA=(2*6)−2=10, and td5 (ph0 to ph180)=tD−½ tA=6−½(2)=5.

In another example of the second operation mode, with reference to FIGS. 2 and 7B, the phase delay magnitude is set near the minimum delay of 6 units and the clock cycle is 8 units. In similar operation to the FIG. 7A diagram explained above, the phase detector 150 adjusts the alignment magnitude until the ph0 signal 165 and the ph360 signal 199 are substantially in phase. In FIG. 7B this results in an alignment magnitude of 4 units for the delay through the first phase aligner 160, and a delay through the second phase aligner 170 of ½ the alignment magnitude, or 2 units.

In another example of the second operation mode, with reference to FIGS. 2 and 7C, operation is shown illustrating an alignment magnitude that approaches the clock period. In the FIG. 7C example the phase delay magnitude is set near the minimum delay of 6 units and the clock cycle is 6 units. As a result, the ph360 signal 199 is about two clock cycles behind the clock input 105. However, the alignment magnitude may still be adjusted to a value sufficient to adjust the ph0 signal 165 to be substantially in phase with the ph360 signal 199. In this case, the phase lock occurs when the alignment magnitude is at 6 units. This operation may be extrapolated to multiple clock cycles difference between the clock input 105 and the ph360 signal 199. Phase lock may still be achieved if the alignment magnitude is adjustable to at least a full clock period.

The second operation mode is not necessarily limited to operation where the phase delay magnitude is set at the minimum delay. It may be desirable to set the phase delay magnitude at a somewhat larger value and still adjust the alignment magnitude to achieve lock. This may be illustrated by referring back to FIG. 6B and FIG. 2. Assume the phase delay magnitude is set at 8 units rather than the minimum delay of 6 units. The phase detector 150 may then adjust the alignment magnitude until lock is achieved. In the case of FIG. 6B, the alignment magnitude would be adjusted to 4 units.

It will be readily apparent to a person of ordinary skill in the art that the first and second operation modes may be combined in various ways. As an example only, the phase detector 150 may set the alignment magnitude to substantially near zero and enter the first operation mode. The first operation mode may reduce the phase delay magnitude until it is substantially near the minimum delay, or some other desirable delay. The phase detector 150 may then enter the second operation mode and begin increasing the alignment magnitude until lock is achieved.

Figure 3:
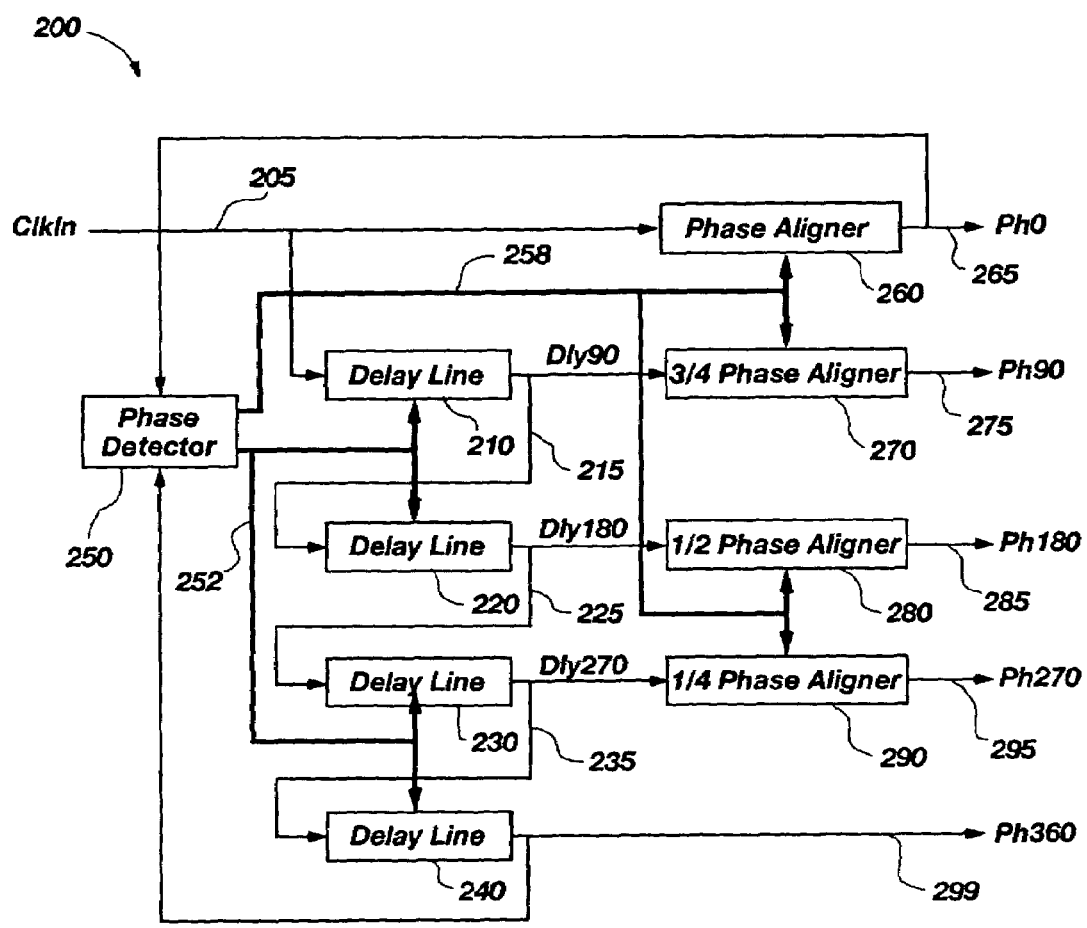
FIG. 3 is a block diagram of an exemplary digital phase generator according to the present invention including four delay lines to generate a 90 degree phase signal, a 180 degree phase signal, and a 270 degree phase signal.

FIG. 3 illustrates another exemplary embodiment of a phase generator 200. The FIG. 3 embodiment is similar to the FIG. 2 embodiment but the phase delays are broken into four parts allowing quadrature separation of the phase signals to generate phases at 90, 180, 270, and 360 degrees. The phase generator 200 according to the present invention includes a phase detector 250, a first delay line 210, a second delay line 220, a third delay line 230, a fourth delay line 240, a first phase aligner 260, a second phase aligner 270, a third phase aligner 280 and a fourth phase aligner 290. A clock input 205 connects to the first delay line 210. A dly90 signal 215 (also referred to as a first phase signal) is generated by the first delay line 210 and connects to the second delay line 220. A dly180 signal 225 (also referred to as a second phase signal) is generated by the second delay line 220 and connects to the third delay line 230. A dly270 signal 235 (also referred to as a third phase signal) is generated by the third delay line 230 and connects to the fourth delay line 240. A ph360 signal 299 (also referred to as a last phase signal) is generated by the fourth delay line 240 and feeds back to the phase detector 250.

The clock input 205 also connects to the first phase aligner 260. A ph0 signal 265 (also referred to as a first aligned phase signal) is generated by the first phase aligner 260 and feeds back to the phase detector 250. The second phase aligner 270 connects to the dly90 signal 215 and generates a ph90 signal 275 (also referred to as a second aligned phase signal). The third phase aligner 280 connects to the dly180 signal 225 and generates a ph180 signal 285 (also referred to as a third aligned phase signal). A fourth phase aligner 290 connects to the dly270 signal 235 and generates a ph270 signal 295 (also referred to as a fourth aligned phase signal).

Additionally, all the delay lines are configured similarly with the same selectable delay increments. Consequently, the delay lines will have substantially the same delay magnitude based on a phase adjustment signal 252, which is generated by the phase detector 250 and selects the delay increments, and as a result, the delay magnitude for the delay lines.

An alignment adjustment signal 258, generated by the phase detector 250, controls the alignment magnitudes (i.e., delay) of the phase aligners. The second phase aligner 270 may be configured with delay increments that are ¾ the size of the delay increments for the first phase aligner 260. The third phase aligner 280 may be configured with delay increments that are ½ the size of the delay increments for the first phase aligner 260. The fourth phase aligner 290 may be configured with delay increments that are ¼ the size of the delay increments for the first phase aligner 260.

Figure 8:
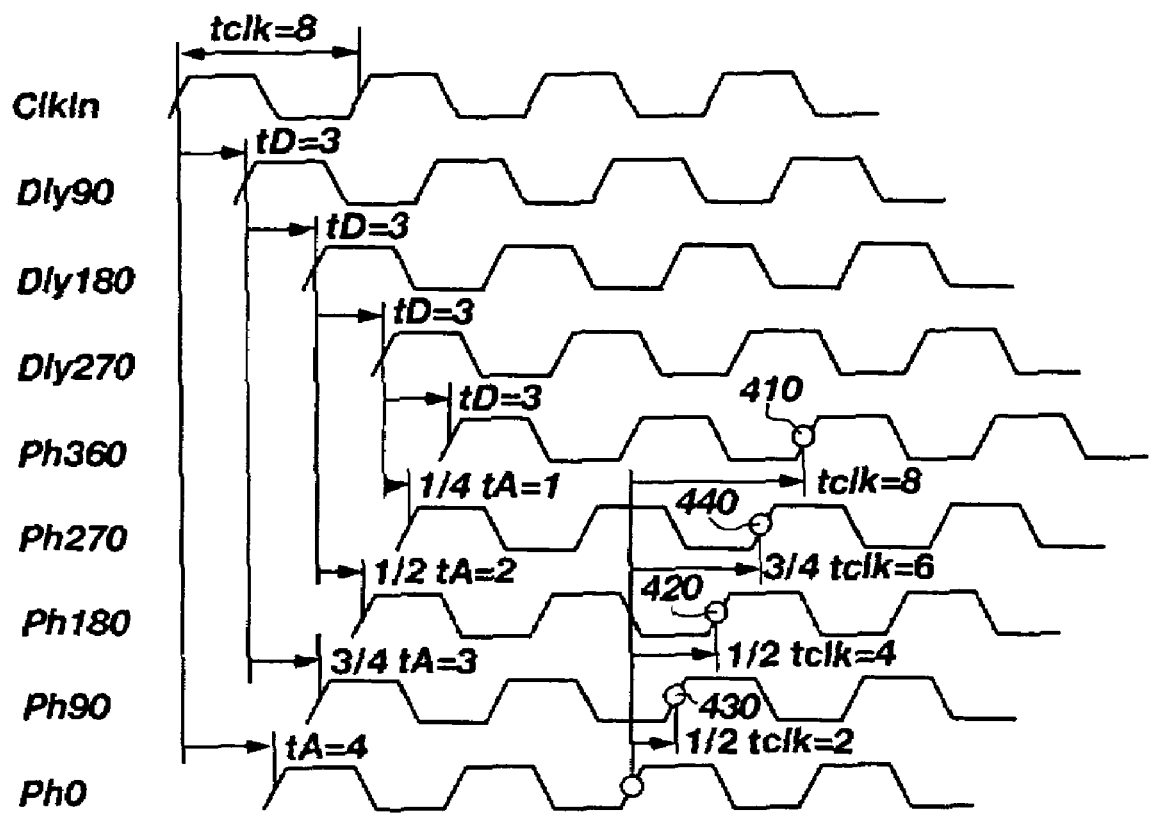
FIG. 8 is a timing waveform showing operation of various phases for the FIG. 3 embodiment at a clock cycle of 8 units.

In operation, the FIG. 3 embodiment is very similar to the embodiment of FIG. 2, except that it is configured to generate the additional ph90 signal 275 and the ph270 signal 295. FIG. 8 is a timing diagram illustrating operation of the FIG. 3 embodiment. With reference to FIGS. 3 and 8, the phase delay magnitude is set to a minimum delay of 3 units and the clock cycle is 8 units. With the phase delay magnitude at 3, the rising edge of the ph360 signal 299 is greater than a clock cycle delay (i.e., 4 delay lines*3 units=12 units) from the rising edge of the clock input 205. However, the first phase aligner 260 may be used to delay the ph0 signal 265 so that the delay from the ph0 signal 265 to the ph360 signal 299 is substantially near a clock cycle (indicated by the first alignment indicator 410), or integer multiple of a clock cycle. In the second operational mode, the phase detector 250 detects a phase difference between the ph0 signal 265 and the ph360 signal 299. However, rather than changing the phase adjustment signal 252 to modify the phase delay magnitude, the phase detector 250 changes the alignment adjustment signal 258 increasing or decreasing the alignment magnitude to achieve phase lock. If the alignment magnitude starts near zero, the phase detector 250 will increase the alignment magnitude until the ph0 signal 265 and the ph360 signal 299 are substantially in phase. In FIG. 8, the alignment magnitude is adjusted to 4 units. Since the ph360 signal 299 is essentially held at a fixed point and the ph0 signal 265 is moved closer to the ph360 signal 299, the ph90 signal 275, the ph180 signal 285, and the ph270 signal 295 must also be moved closer to the ph360 signal 299. However, the ph180 signal 285 should only be delayed by ½ as much as the ph0 signal 265 to maintain the phase relationship at 180 degrees (as show by the second alignment indicator 420). Similarly, the ph90 signal 275 should only be delayed by ¾ as much as the ph0 signal 265 to maintain the phase relationship at 90 degrees (as shown by the third alignment indicator 430) and the ph270 signal 295 should only be delayed by ¼ as much as the ph0 signal 265 to maintain the phase relationship at 270 degrees (as shown by the fourth alignment indicator 440).

Operation of the FIG. 3 embodiment in the first operation mode is similar to that for the FIG. 2 embodiment and need not be discussed in detail.

Figure 4:
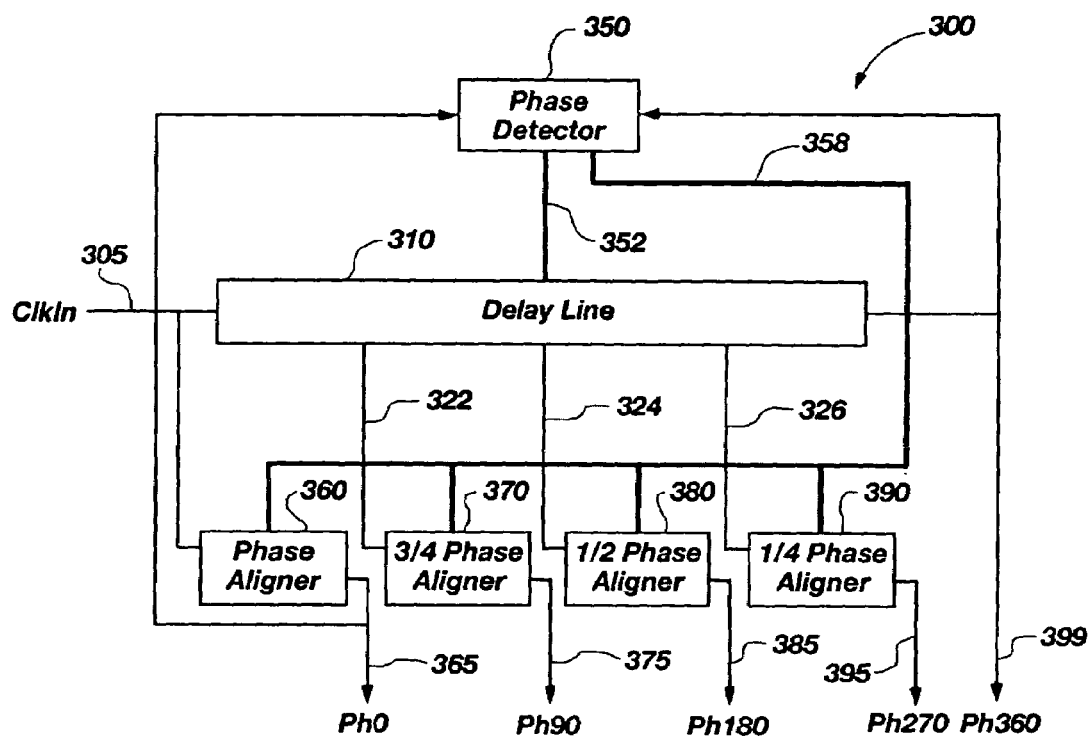
FIG. 4 is a block diagram of an exemplary digital phase generator according to the present invention including a delay line with taps for generating N phase signals with various phase alignments.

FIG. 4 is another embodiment similar to the embodiment of FIG. 3. However, rather than having equal size delay lines generating each phase, this embodiment includes a delay line for the entire clock cycle. The delay line includes taps at various points in the delay line to generate desired phases. The phase generator 300 of FIG. 4 includes a phase detector 350, an adjustable delay line 310, a first phase aligner 360, a second phase aligner 370, a third phase aligner 380 and a fourth phase aligner 390. A clock input 305 connects to the adjusted delay line 310. A first delay tap 322 may be configured at about ¼ of the adjustable delay line 310, a second delay tap 324, may be configured at about ½ of the adjustable delay line 310, and third delay tap 326 may be configured at about ¾ of the adjustable delay line 310. The delay line output 399 (also referred to as a full cycle delay signal) is generated by the adjustable delay line 310 and feeds back to the phase detector 350.

The clock input 305 also connects to the first phase aligner 360. A ph0 signal 365 (also referred to as a first aligned phase signal) is generated by the phase aligner and feeds back to the phase detector 350. A second phase aligner 370 connects to the first delay tap 322 and generates a ph90 signal 375. A third phase aligner 380 connects to the second delay tap 324 and generates a ph180 signal 385. A fourth phase aligner 390 connects to the third delay tap 326 and generates a ph270 signal 395.

A phase adjustment signal 352, generated by the phase detector 350, selects a cycle delay magnitude for the full cycle delay signal 399 and, as a result, the delays to each of the delay tap signals (322, 324, and 326).

An alignment adjustment signal 358, generated by the phase detector 350, controls the alignment magnitudes (i.e., delay) of the phase aligners (360, 370, 380, and 390). The second phase aligner 370 may be configured with delay increments that are ¾ the size of the delay increments for the first phase aligner 360. The third phase aligner 380 may be configured with delay increments that are ½ the size of the delay increments for the first phase aligner 360. The fourth phase aligner 390 may be configured with delay increments that are ¼ the size of the delay increments for the first phase aligner 360.

A person of ordinary skill in the art will recognize that if the taps are placed at ¼, ½, and ¾ of the delay line, then the FIG. 4 embodiment is similar to the FIG. 3 embodiment. Similarly, if only a single tap is placed at the midpoint of the delay line, the FIG. 4 embodiment is similar to the FIG. 2 embodiment. However, when viewed as a long delay line with taps, it becomes clear that many other configurations are possible.

For example, it may not be necessary to generate the 180-degree phase. Consequently, the delay line may only include taps at ¼ and ¾ of the delay line. In another example, it may be desirable to have two equidistant phases for triggering events at two timing points within the clock cycle. For this case, equidistant taps at ⅓ and ⅔ of the delay line (not shown in the drawings) may be desirable. It will be readily apparent to a person of ordinary skill in the art that many combinations are possible and encompassed by the scope of the invention.

General equations for a desired phase alignment delay for any given phase adjuster may be generated based on connection to various delay taps and the alignment magnitude of the first phase aligner 360. Any given delay tap may be defined to have a "tap delay fraction," which is a fractional amount of the cycle delay magnitude on the full cycle delay signal 399. If the delay of any given delay tap is referred to as a tap delay magnitude, the tap delay magnitude may be defined as: (the tap delay fraction*the cycle delay magnitude).

Similarly, any given phase aligner may have delay increments that are a fractional amount of the delay increments of the first phase aligner 360. The proportional relationship of the given phase aligner increment size to the first phase aligner 360 increment size may be related to the tap delay fraction of the delay tap to which the given phase aligner is attached. The resulting proportion may be defined as: ((1−the tap delay fraction)*the first phase aligner 360 increment size.

As an example, suppose a delay tap is set at ⅓ of the delay line (not shown in drawings). The tap delay magnitude would be ⅓ of the cycle delay magnitude. The phase aligner attached to the delay tap may have delay increment sizes proportional to the delay increment sizes of the first phase aligner 360. The proportional relationship is; ((1−⅓)*the first phase aligner 360 increment size)=⅔*the first phase aligner 360 increment size.

Figure 5:
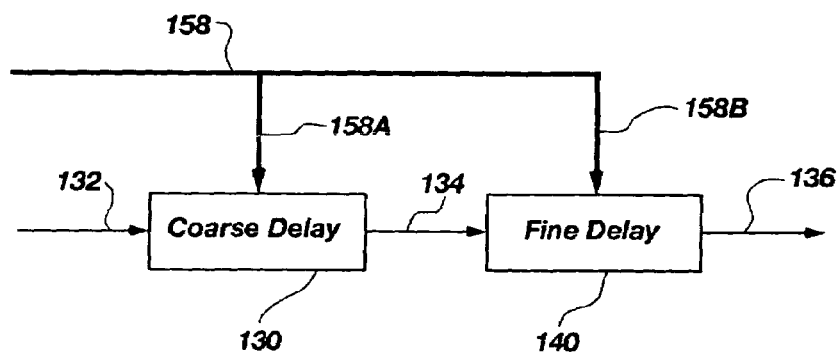
FIG. 5 is a block diagram of an exemplary delay line.

The delay lines of the embodiments described above may be comprised of a coarse delay line 130 and a fine delay line 140 similar to the exemplary embodiment shown in FIG. 5. In the FIG. 5 embodiment, the alignment adjustment signal 158 may include a group of coarse adjustment signals 158A and fine adjustment signals 158B. An input 132 to the delay line connects to the coarse delay line 130. The coarse delay line output 134 connects to the fine delay line 140. A fine delay output 136 may be used as the output of the delay line. It will be readily apparent to a person of ordinary skill in the art that many other configurations and connections of coarse delays and fine delays are possible and contemplated within the invention.

Figure 9:
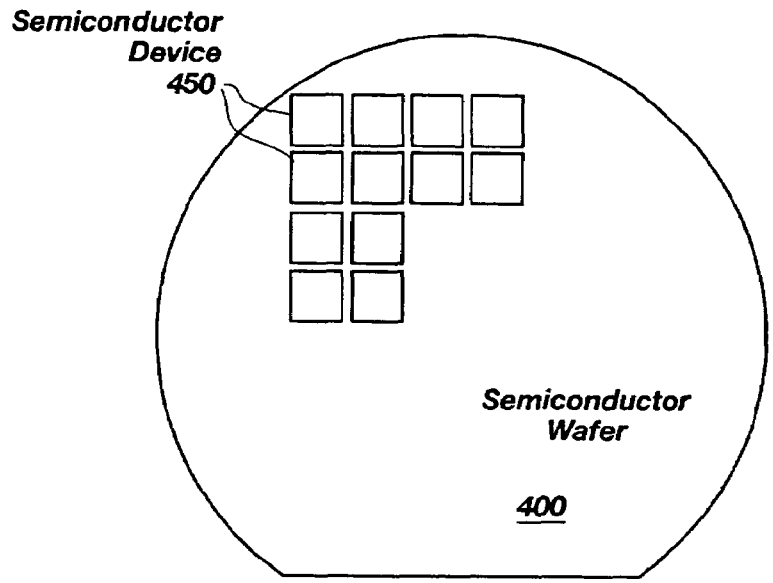
FIG. 9 is a semiconductor wafer including a plurality of semiconductor devices including a phase generator according to the present invention.

As shown in FIG. 9, a semiconductor wafer 400, in accordance with the present invention, includes a plurality of semiconductor devices 450 incorporating the phase generator (100, 200, or 300, not shown in FIG. 6) described herein. Of course, it should be understood that the semiconductor devices 450 may be fabricated on substrates other than a silicon wafer, such as, for example, a Silicon On Insulator (SOI) substrate, a Silicon On Glass (SOG) substrate, or a Silicon On Sapphire (SOS) substrate, a gallium arsenide wafer, an indium phosphide wafer, or other bulk semiconductor substrate. As used herein, the term "wafer" includes and encompasses all such substrates.

Figure 10:
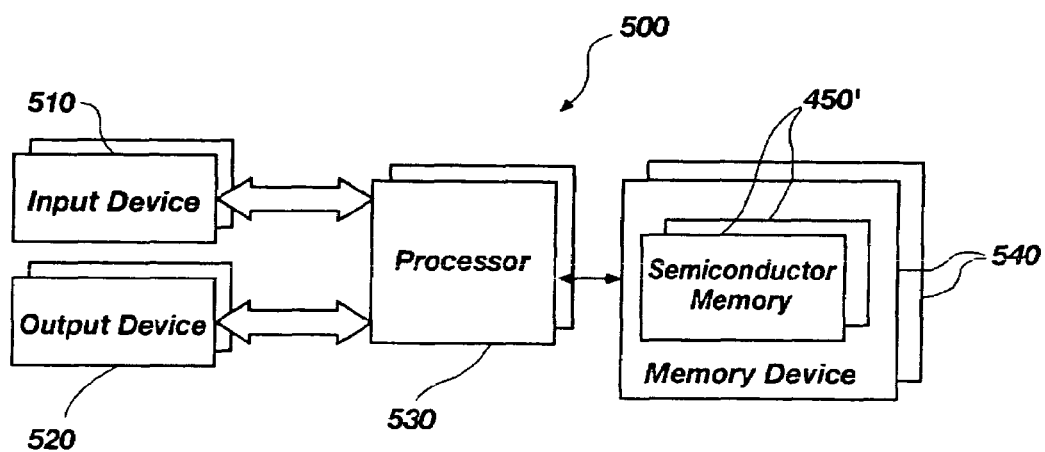
FIG. 10 is an electronic system diagram showing a plurality of semiconductor memories including a phase generator according to the present invention.

As shown in FIG. 10, an electronic system 500, in accordance with the present invention, comprises at least one input device 510, at least one output device 520, at least one processor 530, and at least one memory device 540. The memory device 540 comprises at least one semiconductor memory 450' incorporating the phase generator (100, 200, or 300, not shown in FIG. 7) described herein in a DRAM device. It should be understood that the semiconductor memory 450' may comprise a wide variety of devices other than, or in addition to, a DRAM, including, for example, Static RAM (SRAM) devices, and Flash memory devices.

Although this invention has been described with reference to particular embodiments, the invention is not limited to these described embodiments. Rather, the invention is limited only by the appended claims, which include within their scope all equivalent devices or methods that operate according to the principles of the invention as described.

What is claimed is:

1. A method of generating multi-phase clocks by locking to a clock input with a period less than a minimum possible delay of a delay line configured for generating the multi-phase clocks, comprising:
   generating a first phase signal by delaying a clock input by substantially near a minimum phase delay magnitude;
   generating a last phase signal by delaying the first phase signal by substantially near the minimum phase delay magnitude;
   generating a first aligned phase signal by delaying the clock input by an alignment magnitude;
   generating a second aligned phase signal by delaying the first phase signal by about one-half of the alignment magnitude;
   detecting a phase difference between the first aligned phase signal and the last phase signal; and
   adjusting the alignment magnitude.

2. The method of claim 1, wherein a delay time from the clock input to the last phase signal is larger than a clock period of the clock input.

3. The method of claim 1, wherein adjusting the alignment magnitude further comprises adjusting the alignment magnitude proportional to the phase difference until the phase difference is substantially near zero.

4. The method of claim 1, further comprising adjusting a phase delay magnitude away from substantially near the minimum phase delay magnitude and proportional to the phase difference until the phase difference is substantially near zero.

5. A method of generating multi-phase clocks by locking to a clock input with a period less than a minimum possible delay of a delay line configured for generating the multi-phase clocks, comprising:
   delaying a clock input by a cycle delay magnitude to generate a full cycle delay signal, wherein the cycle delay magnitude is larger than a clock period of the clock input;
   generating N delay taps from the clock input, each delay tap including a tap delay magnitude equal to a fractional amount of the cycle delay magnitude;
   delaying the clock input by an alignment magnitude to generate a first aligned phase signal;
   delaying each of the N delay taps by a tap alignment delay to generate N phase aligned signals;
   detecting a phase difference between the first aligned phase signal and the full cycle delay signal; and
   adjusting the alignment magnitude.

6. The method of claim 5, wherein adjusting the alignment magnitude further comprises adjusting the alignment magnitude proportional to the phase difference until the phase difference is substantially near zero.

7. The method of claim 5, further comprising adjusting the cycle delay magnitude proportional to the phase difference until the phase difference is substantially near zero.

8. The method of claim 5, wherein the tap alignment delay for each of the N delay taps substantially equals (1−the tap delay magnitude)*the alignment magnitude.

9. A method of generating multi-phase clocks, comprising:
   generating a first phase signal by delaying a clock input by substantially near a minimum phase delay magnitude;
   generating a last phase signal by delaying the first phase signal by substantially near the minimum phase delay magnitude;
   generating a first aligned phase signal by delaying the clock input by an alignment magnitude;
   generating a second aligned phase signal by delaying the first phase signal by about one-half of the alignment magnitude;
   detecting a phase difference between the first aligned phase signal and the last phase signal; and
   modifying a combination adjustment, wherein the combination adjustment comprises an adjustment to the phase delay magnitude and an adjustment to the alignment magnitude.

10. The method of claim 9, wherein modifying the combination adjustment further comprises modifying the combination adjustment so the first aligned phase signal and the last phase signal are substantially in phase.

11. A phase generator for generating multi-phase clocks by locking to a clock input with a period less than a minimum possible delay of a delay line configured for generating the multi-phase clocks, comprising:
   a first delay line configured to generate a first phase signal with a phase delay magnitude relative to a clock input;
   a second delay line configured to generate a last phase signal with the phase delay magnitude relative to the first phase signal;
   a first phase aligner configured to generate a first aligned phase signal with an alignment magnitude relative to the clock input;
   a second phase aligner configured to generate a second aligned phase signal with substantially ½ the alignment magnitude relative to the first phase signal; and
   a phase detector configured to compare the first aligned phase signal and the last phase signal, set the phase delay magnitude to substantially near a minimum phase delay magnitude, and generate an alignment adjustment signal for modifying the alignment magnitude.

12. The phase generator of claim 11, wherein a delay through the first delay line and the second delay line is longer than a clock period of the clock input.

13. The phase generator of claim 11, wherein the phase detector is configured to adjust the alignment magnitude so the first aligned phase signal and the last phase signal are substantially in phase.

14. The phase generator of claim 11, wherein the phase detector is configured to adjust the phase delay magnitude away from substantially near the minimum phase delay magnitude so the first aligned phase signal and the last phase signal are substantially in phase.

15. A phase generator for generating multi-phase clocks by locking to a clock input with a period less than a minimum of a delay line configured for generating the multi-phase clocks, comprising:

an adjustable delay line configured for generating a last phase signal by delaying a clock input by a cycle delay magnitude, the adjustable delay line including N delay taps, each of the N delay taps having a tap delay magnitude equal to a fractional amount of the cycle delay magnitude, wherein the cycle delay magnitude is larger than a clock period of the clock input;

a first phase aligner configured for generating a first aligned phase signal by delaying the clock input by an alignment magnitude;

N phase aligners, each of the N phase aligners operably coupled to a corresponding delay tap of the N delay taps and configured to generate a phase aligned signal with a tap alignment delay relative to its delay tap; and a phase detector configured to compare the first aligned phase signal and the last phase signal and generate an alignment adjustment signal for modifying the alignment magnitude.

16. The phase generator of claim 15, wherein the phase detector is further configured to modify the alignment adjustment signal so the first aligned phase signal and the last phase signal are substantially in phase.

17. The phase generator of claim 15, wherein the phase detector is further configured to generate a phase adjustment signal for modifying the cycle delay magnitude so the first aligned phase signal and the last phase signal are substantially in phase.

18. The phase generator of claim 15, wherein the tap alignment delay for each of the N delay taps substantially equals (1−the tap delay magnitude)*the alignment magnitude.

19. A phase generator, comprising:

a first delay line configured to generate a first phase signal with a phase delay magnitude relative to a clock input;

a second delay line configured to generate a last phase signal with the phase delay magnitude relative to the first phase signal;

a first phase aligner configured to generate a first aligned phase signal with an alignment magnitude relative to the clock input;

a second phase aligner configured to generate a second aligned phase signal with substantially ½ the alignment magnitude relative to the first phase signal; and a phase detector configured to compare the first aligned phase signal and the last phase signal, generate a combination adjustment of a phase adjustment signal for modifying the phase delay magnitude, and an alignment adjustment signal for modifying the alignment magnitude.

20. The phase generator of claim 19, wherein the combination adjustment is modified so the first aligned phase signal and the last phase signal are substantially in phase.

21. A semiconductor device including at least one phase generator for generating multi-phase clocks by locking to a clock input with a period less than a minimum possible delay of a delay line configured for generating the multi-phase clocks, the at least one phase generator comprising:

a first delay line configured to generate a first phase signal with a phase delay magnitude relative to a clock input;

a second delay line configured to generate a last phase signal with the phase delay magnitude relative to the first phase signal;

a first phase aligner configured to generate a first aligned phase signal with an alignment magnitude relative to the clock input;

a second phase aligner configured to generate a second aligned phase signal with substantially ½ the alignment magnitude relative to the first phase signal; and a phase detector configured to compare the first aligned phase signal and the last phase signal, set the phase delay magnitude to substantially near a minimum phase delay magnitude, and generate an alignment adjustment signal for modifying the alignment magnitude.

22. The semiconductor device of claim 21, wherein a delay through the first delay line and the second delay line is longer than a clock period of the clock input.

23. The semiconductor device of claim 21, wherein the phase detector is configured to adjust the alignment magnitude so the first aligned phase signal and the last phase signal are substantially in phase.

24. The semiconductor device of claim 21, wherein the phase detector is configured to adjust the phase delay magnitude away from substantially near the minimum phase delay magnitude so the first aligned phase signal and the last phase signal are substantially in phase.

25. A semiconductor device including at least one phase generator for generating multi-phase clocks by locking to a clock input with a period less than a minimum possible delay of a delay line configured for generating the multi-phase clocks, the at least one phase generator comprising:

an adjustable delay line configured for generating a last phase signal by delaying a clock input by a cycle delay magnitude, the adjustable delay line including N delay taps, each of the N delay taps having a rap delay magnitude equal to a fractional amount of the cycle delay magnitude, wherein the cycle delay magnitude is larger than a clock period of the clock input;

a first phase aligner configured for generating a first aligned phase signal by delaying the clock input by an alignment magnitude;

N phase aligners, each of the N phase aligners operably coupled to a corresponding delay tap of the N delay taps and configured to generate a phase aligned signal with a tap alignment delay relative to its delay tap; and a phase detector configured to compare the first aligned phase signal and the last phase signal and generate an alignment adjustment signal for modifying the alignment magnitude.

26. The semiconductor device of claim 25, wherein the phase detector is further configured to modify the alignment adjustment signal so the first aligned phase signal and the last phase signal are substantially in phase.

27. The semiconductor device of claim 25, wherein the phase detector is further configured to generate a phase adjustment signal for modifying the cycle delay magnitude so the first aligned phase signal and the last phase signal are substantially in phase.

28. The semiconductor device of claim 25, wherein the tap alignment delay for each of the N delay taps substantially equals (1−the tap delay magnitude)*the alignment magnitude.

29. A semiconductor device including at least one phase generator, the at least one phase generator comprising:

a first delay line configured to generate a first phase signal with a phase delay magnitude relative to a clock input;

a second delay line configured to generate a last phase signal with the phase delay magnitude relative to the first phase signal;

a first phase aligner configured to generate a first aligned phase signal with an alignment magnitude relative to the clock input;
a second phase aligner configured to generate a second aligned phase signal with substantially ½ the alignment magnitude relative to the first phase signal; and
a phase detector configured to compare the first aligned phase signal and the last phase signal, generate a combination adjustment of a phase adjustment signal for modifying the phase delay magnitude, and an alignment adjustment signal for modifying the alignment magnitude.

30. The semiconductor device of claim 29, wherein the combination adjustment is modified so the first aligned phase signal and the last phase signal are substantially in phase.

* * * * *

UNITED STATES PATENT AND TRADEMARK OFFICE
CERTIFICATE OF CORRECTION

PATENT NO.      : 7,274,228 B2                                     Page 1 of 1
APPLICATION NO. : 11/413790
DATED           : September 25, 2007
INVENTOR(S)     : Kim It is certified that error appears in the above-identified patent and that said Letters Patent is hereby corrected as shown below:

In column 15, line 40, in Claim 19, delete "alignment" and insert -- alignment --, therefor.

In column 16, line 31, in Claim 25, delete "rap" and insert -- tap --, therefor.

Signed and Sealed this

Twenty-seventh Day of November, 2007

JON W. DUDAS
*Director of the United States Patent and Trademark Office*